United States Patent [19]

Amaya

[11] 4,004,232

[45] Jan. 18, 1977

[54] RADIO RECEIVER TUNING CONTROL SYSTEM

[75] Inventor: Yuji Amaya, Kobe, Japan

[73] Assignee: Fujitsu Ten Ltd., Kobe, Japan

[22] Filed: Dec. 23, 1975

[21] Appl. No.: 643,641

[30] Foreign Application Priority Data

Dec. 27, 1974 Japan .............................. 49-148883
June 30, 1975 Japan .............................. 50-81731

[52] U.S. Cl. .............................. 325/421; 325/455; 325/464; 331/18
[51] Int. Cl.² .......................................... H04B 1/32
[58] Field of Search .......... 325/418, 419, 420, 421, 325/422, 453, 455, 464, 465; 331/1 A, 18, 25, 34, 64

[56] References Cited

UNITED STATES PATENTS 3,883,807  5/1975  Alberkrack ..................... 325/453
3,962,640  6/1976  Bomba ............................ 325/421

Primary Examiner—Benedict V. Safourck
Attorney, Agent, or Firm—Daniel Jay Tick

[57] ABSTRACT

A radio receiver tuning control system automatically selects a desired station through digital operation. A counting value based on the local oscillating frequency signal of the local oscillator of a receiver is compared, digit by digit, with a value corresponding to a specified frequency signal of a predetermined desired station. The local oscillator is controlled in order to maintain coincidence between the counting value and the specified value in accordance with the comparison result.

12 Claims, 12 Drawing Figures

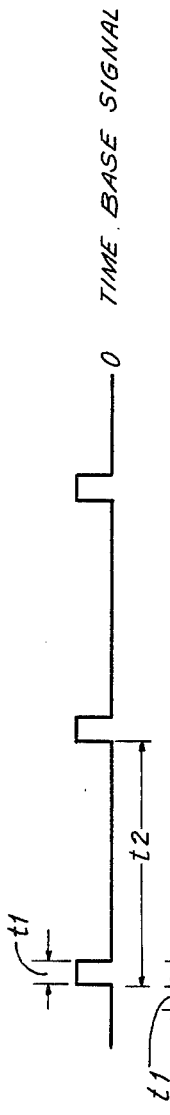
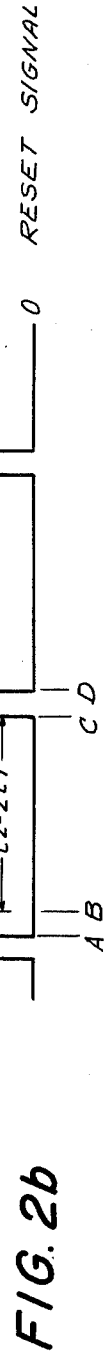
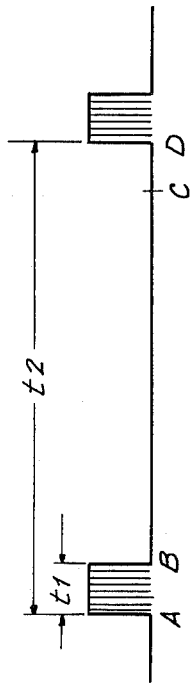
FIG.2a  FIG.2b  FIG.2c  FIG.2d  FIG.2e  FIG.2f
FIG.3

RADIO RECEIVER TUNING CONTROL SYSTEM

BACKGROUND OF THE INVENTION

The present invention relates to a tuning control system of a radio receiver. More particularly, the invention relates to a radio receiver tuning control system wherein a desired station is automatically selected by digital operation.

A conventional radio receiver utilizes the following tuning systems. The radio receiver is tuned to the frequency of a desired station by varying the inductance or capacitance of the tuning circuit by appropriate turns of a tuning knob, or to a frequency selected mechanically from stored or recorded frequency signals. The latter is accomplished by previously storing or recording a plurality of desired station frequency signals in a plurality of push-button mechanisms as the mechanical positions of the inductive element or the capacitive element of the tuning circuit. The latter arrangement is the well known push-button type tuning system.

The push-button tuning system is widely used for a mobile radio receiver, because it is capable of preset tuning. The mobile radio receiver, however, must be compact. For this reason, the mobile radio receiver of the latter type in which the preset operation is carried out mechanically is usually capable of selecting about five stations, or frequencies, since the number of presetting times is restricted. Thus, when the receiving area is widened or changed, due to the movement of the vehicle in which the radio receiver is installed, the preset type push-button mechanism cannot cover the receiving frequencies. Therefore, in such a case, the aforedescribed tuning system is very disadvantageous, since a resetting operation is required by releasing the preset condition.

Furthermore, the automatic tuning receiver is in practical use as a mobile radio receiver. The receiver is sequentially tuned to the frequency signals of stations after an automatic sweep for the receiving frequencies. As a result of the use of a semiconductor variable capacitance element in the tuning circuit, the variable control voltage of the variable capacitance element is changed continuously with a potentiometer.

This type of receiver is very advantageous, since all the broadcasting stations in the receiving area can be selected automatically. However, when the broadcasting stations are located next adjacent each other, a longer time is required in order to receive the desired station frequency, since each station must be received sequentially. Furthermore, the selection switch has to be operated each time the station frequency is received. This is a serious disadvantage of this type of tuning system.

As hereinbefore described, the push-button tuning receiver can immediately select the desired station, but cannot cover the overall receiving area. The automatic tuning receiver can receive the signal over the entire receiving area, but cannot select the station immediately. Thus, these systems have an advantage, on one hand, but have a disadvantage, on the other hand, in mobile radio receivers. This raises problems requiring solution.

The principal object of the invention is to provide a radio receiver tuning control system which functions to immediately select a desired station anywhere in the entire receiving range.

An object of the invention is to provide a radio receiver tuning control system which overcomes the disadvantages of known types of push-button and automatic tuning receivers, but provides the advantages thereof.

Another object of the invention is to provide a radio receiver tuning control system which functions efficiently, effectively and reliably to tune a receiver as desired.

Still another object of the invention is to provide a radio receiver tuning control system which performs, in a frequency sweep operation for tuning, a frequency sweep at a comparatively high speed for frequencies other than the specified frequency and at a lower sweep speed for frequencies near the specified frequency, thereby reducing the frequency sweep time without generating "hunting phenomenon" during the tuning operation.

Yet another object of the invention is to provide a radio receiver tuning control system having digital frequency setting means in which the selecting operation of the desired broadcasting station signal is facilitated by converting the value corresponding to each specified frequency signal into a digital signal at a diode matrix circuit and storing the digital signal.

BRIEF SUMMARY OF THE INVENTION

The tuning control system of the invention is capable of selecting the desired station by digital operation. The local oscillating frequency signal provided by the local oscillator of a radio receiver is converted into a receiving frequency. The converted signal is then counted. After counting, the counting value is compared, digit by digit, with a value corresponding to a preset frequency signal of a desired station. The local oscillator is automatically controlled in order to maintain coincidence between the counting value and the preset value in accordance with the comparison result.

In the comparison result between the counting value and the preset value, when it is detected that the second uppermost digits coincide, the control of the local oscillator is reduced in magnitude.

In accordance with the invention, a tuning control system for a radio receiver having a tuning circuit including a variable reactance element as the tuning element and a local oscillator, comprises voltage circuit means for controlling the reactance of the variable reactance element of the tuning circuit of a radio receiver. The voltage circuit means has an output coupled to the variable reactance element and an input. Gate circuit means connected to the local oscillator of the tuning circuit of the radio receiver derives a frequency signal from the local oscillator during a specified period of time and providing the frequency signal. Counting circuit means connected to the gate circuit means counts the frequency signal provided by the gate circuit means. The counting circuit means has output means. Digital setting circuit means designates a preset frequency of a desired station. The digital setting circuit means has output means. Digital comparator means has input means connected to the output means of the counting circuit means and the digital setting circuit means and compares signals in the output means of the counting circuit means and the digital setting circuit means and provides output signals indicating coincidence and non-coincidence of the signals compared thereby. The digital comparator means has output means. Control voltage generating circuit means has input means connected to the output means of the digital comparator means and an output connected to the input of the voltage circuit means and detects coincidence and non-coincidence indications in the output signals of the comparator means and controls the supply of a sweep signal to the voltage circuit means. The radio receiver is thus automatically tuned to the desired frequency.

The voltage circuit means comprises a voltage memory circuit having a memory element settable at a desired output voltage level and provides an output voltage in accordance with the polarity of a voltage applied thereto.

The gate circuit means comprises time base signal generating circuit means for providing a continuous gate pulse having a predetermined period. The time base signal generating circuit means has an output. A logical AND gate has an input coupled to the local oscillator and another input connected to the output of the time base signal generating circuit means for providing the frequency signal derived from the local oscillator only when the time base signal generating circuit means supplies a time base signal thereto.

Reset signal generating circuit means connected to the counting circuit means resets the counting circuit means prior to each counting by the counting circuit means of the frequency signal provided by the gate circuit means.

The counting circuit means comprises counter circuit means and shift circuit means connecting the gate circuit means to the counter circuit means. The shift circuit means shifts the frequency signal provided by the gate circuit means by a number of pulses corresponding to an IF signal of the radio receiver and provides a shifted frequency signal output. The counter circuit means counts the shifted frequency signal output of the shift circuit means.

The counting circuit means provides an output count signal at the output means thereof. Frequency indicating means coupled to the output means of the counting circuit means indicates the output count signal of the counting circuit means as a frequency.

The radio receiver includes a frequency discriminator.

Automatic frequency control circuit means having input means connected to the frequency discriminator of the radio receiver and output means connected to the control voltage generating circuit means detects a DC voltage in accordance with the shift of the tuning frequency supplied by the frequency discriminator of the receiver and controls the supply of the sweep signal to the voltage circuit means.

The digital setting circuit means comprises a diode matrix circuit for storing a plurality of designation signals and selection switch means connected to the matrix circuit for selecting a desired designation signal. The diode matrix circuit has outputs.

A selection cartridge consists of a box type case and accommodates the diode matrix circuit therein. A receiver housing unit has a cartridge container provided therein for removably accommodating the selection cartridge. Coupling means in the housing unit at the cartridge container connects the outputs of the diode matrix circuit to the input means of the digital comparator means when the selection cartridge is mounted in the cartridge container.

In accordance with the invention, a tuning control system for a radio receiver having a tuning circuit including a variable reactance element as the tuning element and a local oscillator comprises voltage circuit means for controlling the reactance of the variable reactance element of the tuning circuit of a radio receiver. THe voltage circuit means has an output coupled to the variable reactance element and an input. Gate circuit means connected to the local oscillator of the tuning circuit of the radio receiver derives a frequency signal from the local oscillator during a specified period of time and provides the frequency signal. Counting circuit means for a plurality of digits is connected to the gate circuit means for counting the frequency signal provided by the gate circuit means. The counting circuit means has output means. Digital setting circuit means having a plurality of digits designates a frequency of a desired station. The digital setting circuit means has output means providing designated frequency output signals. Digital comparator means having input means connected to the output means of the counting circuit means and the digital setting circuit means compares signals in the output means of the counting circuit means and the digital setting circuit means and provides output signals indicating coincidence and non-coincidence of the signals compared thereby. The digital comparator means has output means. The digital comparator means comprises a plurality of digital comparators connected in tandem, each comparing the output signals of the counting circuit means and the designated frequency output signals of the digital setting circuit means for each digit. The digital comparators include an ultimate digital comparator comparing the highest digit of the output signals and a penultimate digital comparator comparing the second highest digit of the output signals. Control voltage generating circuit means having input means connected to the output means of the digital comparator means and an output connected to the input of the voltage circuit means detects coincidence and non-coincidence indications in the output signals of the comparator means and controls the commencement and termination of supply of a sweep signal to the voltage circuit means. Sweep control circuit means connected between the penultimate and ultimate digital comparators of the digital comparator means and the input means of the control voltage generating circuit means detects coincidence indications in the output signals of the penultimate one of the digital comparators and intermittently enables the supply of the sweep signal from the control voltage generating circuit means. The radio receiver is thus automatically tuned to the desired broadcasting frequency.

The digital setting circuit means comprises a plurality of digital setting circuits, each connected to a corresponding one of the digital comparators and each representing a digit of the designated frequency.

The sweep control circuit means comprises a NAND gate having a first input, a second input and an output. A detector circuit detects coincidence and non-coincidence of the second highest digit in the output signals of the penultimate digital comparator. The detector circuit has an output connected to the first input of the NAND gate. Pulse signal generating means has an output connected to the second input of the NAND gate. Clamp means connected to the output of the NAND gate and to the output means of the digital comparator means clamps part of the output signal of the ultimate digital comparator to a point at ground potential when the output signals of the ultimate digital comparator indicate coincidence in correspondence with an intermittent output signal from the NAND gate.

BRIEF DESCRIPTION OF THE DRAWINGS

In order that the invention may be readily carried into effect, it will now be described with reference to the accompanying drawings, wherein:

FIGS. 2a, 2b, 2c, 2d, 2e and 2f are waveforms for explaining the operation of the tuning control system of FIG. 1;

FIG. 3 is a waveform of the local oscillating frequency signal counted by the counter of the tuning control system of the invention;

In the FIGS., the same components are identified by the same reference numerals.

DETAILED DESCRIPTION OF THE INVENTION

Figure 1:
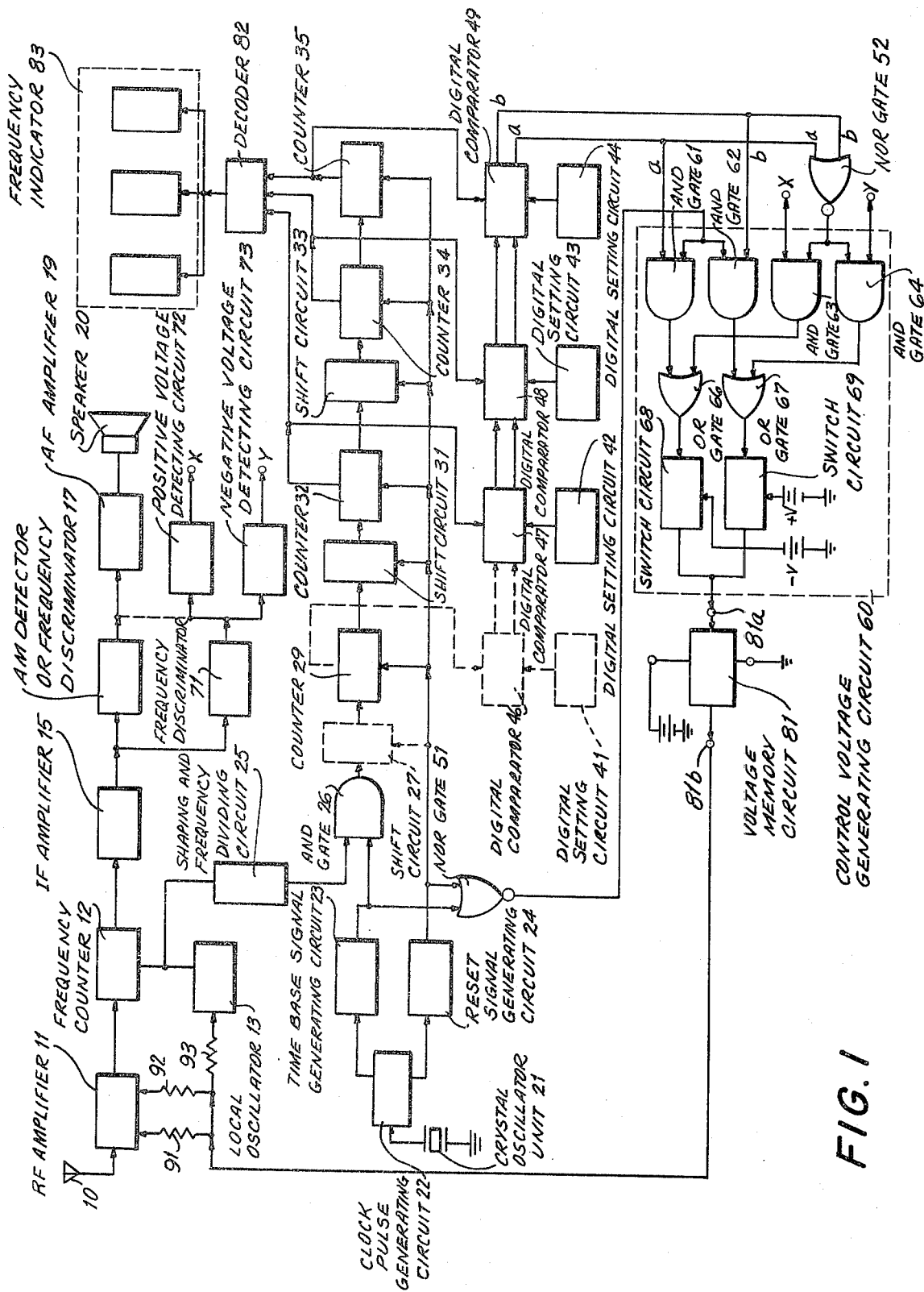
FIG. 1 is a block diagram of an embodiment of the radio receiver tuning control system of the invention.

In FIG. 1, an RF amplifier 11 has an input connected to an antenna 10, and an output. The output of the RF amplifier 11 is connected to an input of a frequency converter 12. The output of a local oscillator 13 is connected to the other input of the frequency converter 12. The output of the frequency converter 12 is connected to the input of an IF amplifier 15. The output of the IF amplifier is connected to the input of an AM detector or frequency discriminator 17. The output of the AM detector or frequency discriminator 17 is connected to the input of an AF amplifier 19. The output of the AF amplifier 19 is connected to a speaker 20.

A crystal oscillator unit 21 is connected between a point at ground potential and the input of a clock pulse generating circuit 22. The clock pulse generating circuit 22 provides an output to the input of a time base signal generating circuit 23 and to the input of a reset signal generating circuit 24.

The output of the local oscillator 13 is also connected to the input of a shaping and frequency dividing circuit 25. The output of the shaping and frequency dividing circuit 25 is connected to an input of an AND gate 26. The output of the time base signal generating circuit 23 is connected in common to another input of the AND gate 26 and an input of a NOR gate 51. The output of the AND gate 26 is connected to an input of a shift circuit 27. The output of the shift circuit 27 is connected to an input of a counter 29.

An output of the counter 29 is connected to an input of another shift circuit 31. The output of the shift circuit 31 is connected to an input of another counter 32. An output of the counter 32 is connected to an input of another shift circuit 33. The output of the shift circuit 33 is connected to an input of still another counter 34. An output of the counter 34 is connected to an input of yet another counter 35.

The output of the reset signal generating circuit 24 is connected in common to the other input of the NOR gate 51, the other input of the shift circuit 27, the other input of the counter 29, the other input of the shift circuit 31, the other input of the counter 32, the other input of the shift circuit 33, the other input of the counter 34 and the other input of the counter 35.

A plurality of digital setting circuits 41, 42, 43 and 44 are provided. The digital setting circuit 41 has an output connected to an input of a digital comparator 46. The other input of the digital comparator 46 is connected to the other output of the counter 29. The output of the digital setting circuit 42 is connected to an input of the digital comparator 47. Another input of the digital comparator 47 is connected to the other output of the counter 32. Both outputs of the digital comparator 46 are connected to corresponding inputs of the digital comparator 47.

The output of the digital setting circuit 43 is connected to an input of a digital comparator 48. Another input of the digital comparator 48 is connected to the other output of the counter 34. Both outputs of the digital comparator 47 are connected to corresponding inputs of the digital comparator 48. The output of the digital setting circuit 44 is connected to an input of a digital comparator 49. Another input of the digital comparator 49 is connected to the output of the counter 35. Both outputs of the digital comparator 48 are connected to corresponding inputs of the digital comparator 49.

One of the outputs a of the digital comparator 49 is connected to an input of a NOR gate 52 and the other output b of said digital comparator is connected to the other input of said NOR gate. The outputs of the NOR gates 51 and 52 are connected to inputs of a control voltage generating circuit 60. The output of the NOR gate 51 is connected in common to an input of each of a pair of AND gates 61 and 62 of the control voltage generating circuit 60. The first output a of the digital comparator 49 is connected to the other input of the AND gate 61 and the second output b of said digital comparator is connected to the other input of the AND gate 62.

The output of the NOR gate 52 is connected in common to an input of each of a pair of AND gates 63 and 64 of the control voltage generating circuit 60. The other input of the AND gate 63 is connected to an output terminal X, hereinafter described. The other input of the AND gate 64 is connected to an output terminal Y, hereinafter described.

The output of the AND gate 61 is connected to an input of an OR gate 66 of the control voltage generating circuit 60 and the output of the AND gate 63 is connected to the other input of said OR gate. The output of the AND gate 62 is connected to an input of an OR gate 67 of the control generating circuit 60 and the output of the AND gate 64 is connected to the other input of said OR gate. The output of the OR gate 66 is connected to an input of a first switch circuit 68 of the control voltage generating circuit 60. A negative voltage − V is applied to the other input of the first switch circuit 68. The output of the OR gate 67 is connected to an input of a second switch circuit 69 of the control voltage generating circuit 60. A positive DC voltage + V is applied to the other input of the second switch circuit 69.

A frequency discriminator 71 has an input connected to a common point in the connection between the IF amplifier 15 and the AM detector or frequency discriminator 17 and an output connected in common to the inputs of a positive voltage detecting circuit 72 and a negative voltage detecting circuit 73. The inputs of the positive and negative voltage detecting circuits 72 and 73 are also connected in common to a common point in the connection between the AM detector or frequency discriminator 17 and the AF amplifier 19. The positive voltage detecting circuit 72 has an output terminal X. The negative voltage detecting circuit 73 has an output terminal Y.

The outputs of each of the counters 32, 34 and 35 connected to inputs of the digital comparators 47, 48 and 49, respectively, are also connected in common to corresponding inputs of a decoder 82. The output of the decoder 82 is connected in common to inputs of a frequency indicator 83.

The outputs of the first and second switch circuits 68 and 69 of the control voltage generating circuit 60 are connected in common to the input terminal 81a of a voltage memory circuit 81. The output terminal 81b of the voltage memory circuit 81 is connected to corresponding inputs of the RF amplifier 11 via resistors 91 and 92, respectively, and to the input of the local oscillator 13 via a resistor 93.

The component 17 is an AM detector when the radio receiver is an AM receiver and is a frequency discriminator when the radio receiver is an FM receiver. The components 11, 12, 13, 15, 17, 19 and 20 constitute a known superheterodyne receiver. The local oscillation frequency signal is considered to be higher than the receiving frequency by as much as the difference from the intermediate frequency when tuning is attained.

The RF amplifier 11 and the local oscillator 13 constitute a variable reactance element. The variable reactance element is generally a variable capacitance diode which can vary the tuning frequency in accordance with a variable input voltage. A variable control voltage is applied through the resistors 91, 92 and 93 in order to automatically control the variable capacitance diodes. Two RF amplifier stages are utilized in FIG. 1.

The crystal oscillator unit 21 may comprise a ceramic resonant element. The clock pulse generating circuit 22 generates a signal for determining the counting time, the counting hold time and the timing of the reset signal, hereinafter described. The clock pulse generating circuit 22 must be highly accurate and stable. The time base signal generating circuit 23 generates a gate pulse which determines the counting time. The reset signal generating circuit 24 generates a reset pulse which clears the counting contents of the counter and resets the counter, as hereinafter mentioned. The shaping and frequency dividing circuit 25 shapes the local oscillator signal from the local oscillator 13 and divides its frequency, as required.

When the receiver is an AM receiver, the local oscillation frequency signal is directly used, whereas when the receiver is an FM receiver, said signal is divided into 1/10, thereby lowering the frequency order by one digit. When necessary, an amplifier is also included.

FIG. 2a shows the time base signal and FIG. 2b shows the reset signal. These signals are obtained by dividing and gate operations. FIG. 3 shows the signal transferred by the AND gate 26 of FIG. 1.

The pulses corresponding to the local oscillating frequency signal included in the time t1 within the period AB, shown in FIGS. 2a and 2b, are counted by the counter, as hereinafter described. The pulse in the period CD is the reset pulse. The counting value or content of the counter are therefore held during the period t2 to 2t1, as shown in FIG. 2b. The time instants t1 and t2 are selected in consideration of the entire receiver.

The shift circuits 27, 31 and 33 are identical. The counters 29, 32, 34 and 35 are identical. The digital setting circuits 41, 42, 43 and 44 are identical. The digital comparators 46, 47, 48 and 49 are identical.

In operation of the AM receiver, the shift circuits 27, 31 and 33 shift the intermediate frequency, or IF, signal of 455 kHz. The counters 29, 32, 34 and 35 are decimal counters which subtract the IF signal from the local oscillating frequency signal and provide as outputs the counting result or counting value, digit by digit. The digital setting circuits 41, 42, 43 and 44 set the designated frequency signal of a desired station, digit by digit. The digital comparators 46, 47, 48 and 49 compare the counting value or counting result of each digit and the value of each digit of the designated frequency signal set by the digital setting circuits, and provide outputs in accordance with the results of such comparisons.

When the designated frequency is assumed as 1240 kHz, the local oscillating frequency is 1695 kHz. When the pulse width or duration t1 of the time base signal in FIG. 2a is assumed to be 1 msec and the pulse width or duration t2 to be 10 msec, the signal at the output of the AND gate 26, shown in FIG. 3, includes 1695 pulses within a width or duration of 1 msec at the time the local oscillating frequency coincides with the correct frequency.

In the aforedescribed case, "1", "2", "4" and "0" are respectively set in the digital setting circuits 44, 43, 42 and 41. The shift circuits and the counters operate upon receiving the signal shown in FIG. 3. More particularly, five pulses are shifted in the shift circuit 27 and the counter 29 starts counting from the 6th pulse. Five pulses are shifted in the shift circuit 31, as in the foregoing instance, and the counter 32 starts the counting from the 156th pulse. Four pulses are then shifted in the shift circuit 33 and the counter 34 starts the counting from the 456th pulse.

Thus, each counter provides an output corresponding to the value of each digit obtained by subtracting the IF signal of 455 kHz from the local oscillating frequency and each digit is respectively compared with "1", "2", "4" and "0" previously set at the digital comparator. When the designated frequency is indicated by three digits, like 690 kHz, for example, "0", "6" and "9" are set by the digital setting circuits. After the counting operation as hereinbefore described, the counting result or counting value is compared at the digital comparators. A digital switch is used for the digital circuits at the digital comparators.

The digital comparators 46, 47, 48 and 49 are in sequential cascade connection. When the counting output, value or result of the counters is assumed to be A and the setting value of the digital setting circuits is assumed to be B, the digital comparator 49, for example, provides the following output at its output terminals a and b, according to the values of A and B.

---

When A = B,  a = 0, b = 0
When A > B,  a = 1, b = 0

-continued

| When A < B, | a = 0, b = 1 |
|---|---|

Since the digital comparators 46, 47, 48 and 49 respectively compare a value less than 10, a binary counter of 4 bits may be sufficiently used. Therefore, comparator circuits of 4 bits × 4 = 16 bits may be formed by combination.

In the comparison by means of the digital setting, a comparison up to 1 kHz is accomplished. In case of frequency allocation in AM broadcasting, however, the digit of 1 kHz is usually zero, and the value set in the digital setting circuit 41 is always zero. For this reason, comparison for the digit of 1 kHz is not provided, and for automatic tuning of the digit of 1 kHz, the automatic frequency control or AFC circuit is considered to be separately provided.

Another embodiment of the tuning control system is described as follows. First, since the digital setting circuit 41 is removed, the digital comparator 46 is not required. The shift circuit 27 is also removed, making the number of shifts of the IF signal 450. Thus, in this embodiment the components shown by broken lines in FIG. 1 are removed. As a result, the digital settings for the designated frequencies 1240 kHz and 690 kHz may be made by three digits, as "1", "2", "4" and "0", "6", "9", respectively.

The reason why the number of shifts of the IF signal is selected to be 450 is described as follows. In the case of 1240 kHz, for example, the local oscillating frequency becomes 1695 kHz. If the local oscillating frequency varies around this frequency, the following relations between the counter output and digital setting value can be obtained.

| Local oscillating frequency | Number of shifts | Counter output | Digital setting value |
|---|---|---|---|
| 1689 | 450 | 1239 | 123 |
| 1690 | 450 | 1240 | 124 |
| 1695 | 450 | 1245 | 124 |
| 1699 | 450 | 1249 | 124 |
| 1700 | 450 | 1250 | 125 |

As indicated by the foregoing table, when the local oscillating frequency changes by +4 kHz or −5 kHz around the center frequency 1695 kHz, the counter output coincides with the digital setting value. If it is shifted by 455, as understood from the indicated relations, the counter output coincides with the digital setting value when there are variations of +9 kHz and −0, while it differs from the digital setting value if there is a variation of −1 kHz. The local oscillating frequency thus changes by +9 kHz, creating a disadvantage in the use of an AFC circuit.

The AFC circuit comprises the frequency discriminator 71, the positive voltage detecting circuit 72 and the negative voltage detecting circuit 73. When the IF signal is higher than the specified level, that is, when the local oscillating frequency signal is higher than the specified level, the frequency discriminator 71 detects a positive voltage and the positive voltage detecting circuit 72 rectifies and amplifies such positive voltage before providing it as an output. If the IF signal is lower than the specified level, on the contrary, the negative voltage detecting circuit 73 rectifies and amplifies the signal before providing it as an output.

The outputs of the digital comparator 49, the NOR gate 51, the positive voltage detecting circuit 72 and the negative voltage detecting circuit 73 provide the variable control signal applied to the variable capacitance diodes in the RF amplifier 11 and the local oscillator 13, via the voltage memory circuit 81, by means of the control voltage generating circuit 60.

The voltage memory circuit 81, which is also known as a voltage memory element, is described in my copending patent application Ser. No. F300F31, filed December, 1975, and in U.S. Pat. No. 3,889,133 to Oka et al, entitled "Output Voltage Variable Device". The voltage memory circuit 81 comprises, for example a capacitor which is charged through a neon tube and a field effect transistor which provides an output for the capacitor voltage.

As shown in FIG. 1, the voltage memory circuit 81 has four terminals. When a positive DC control voltage is applied to the input terminal 81a of the voltage memory circuit, said circuit provides, at the output terminal 81b, a DC output voltage which gradually increases in proportion to the function of time. When there is no input, the DC voltage at that time is stored in the voltage memory circuit 81 for a long time for continuing an output. When a negative DC control voltage is applied to the input terminal 81a, the voltage memory circuit has a characteristic of gradually reducing the DC output voltage in proportion to the function of time, that is, a function of the so-called volume control.

The NOR gate 51 operates with the signals of the time base signal generating circuit 23 and reset signal generating circuit 24. In other words, the NOR gate 51 provides an output signal "1" within the level 0 period between $t_2$ to $2t_1$, shown in FIGS. 2a and 2b. Therefore, when there is an output of the NOR gate 51, that is, only when the counting result is determined, the AND gates 61 and 62 are in their open, conductive or operative condition. In other words, when A > B, and $a = 1, b = 0$ in the outputs of the digital comparator 49, the AND gate 61 is conductive and operates the switch circuit 68 via the OR gate 66. This results in the negative DC control voltage −V being applied to the input terminal 81a of the voltage memory circuit 81. The voltage level of the voltage memory circuit 81 thus decreases, and, therefore, by lowering the control voltage of the variable capacitance diode, the local oscillating frequency is lowered. Although the RF signal is simultaneously controlled, the description of said signal is omitted for simplification of the description.

When A < B, and $a = 0$ and $b = 1$ in the outputs of the digital comparator 49, on the contrary, the AND gate 62 is conductive and operates the switch circuit 69 via the OR gate 67. This results in the increasing of the output voltage level of the voltage memory circuit 81. The control voltage of the variable capacitance diode is thereby increased and the local oscillating frequency is increased.

In case A = B and $a = 0, b = 0$ in the outputs of the digital comparator 49, the counting result coincides with the digital setting value. In such a case, there is no need to correct the local oscillating frequency. The AND gates 61 and 62 are in their non-conductive, closed or inoperative condition. If the local oscillating frequency does not coincide at the digit of 1 kHz, even when A = B, the positive voltage detecting circuit 72 or the negative voltage detecting circuit 73 provides an output at its output terminal X or Y, respectively, to operate the AFC circuit. In other words, when $a = 0$, $b = 0$ in the outputs of the digital comparator 49, the NOR gate 52 is in its operative condition, as hereinbefore mentioned, wherein the counting result of the counter is maintained. This condition prevails only during the period $t2$ to $2t1$.

When there is an input at the input terminal X of the AND gate 63, said AND gate switches to its conductive condition, and when there is an input at the input terminal Y of the AND gate 64, said AND gate switches to its conductive condition. As hereinbefore mentioned, when the AND gate 63 is in operative condition, the local oscillating frequency is decreased and when the AND gate 64 is in operative condition, the local oscillating frequency is increased. Thus, when there is no output at the output terminals X and Y of the positive and negative voltage detecting circuits 72 and 73, that is, when the local oscillating frequency coincides with the specified or preset frequency, the AFC operation terminates.

As hereinbefore described, when there is a difference between the counter output and the setting value, the local oscillating frequency is automatically corrected. The time required for only a single frequency correction is $t2$ to $2t1$, and such correction is repeated $n$ times. Finally, the local oscillating frequency coincides with the setting frequency. The value of $n$ is determined in accordance with the difference between the counter output and the setting value and the variation of the local oscillating frequency within the period $t2$ to $2t1$.

It has been proven experimentally that the optimum frequency variation shall be comparatively small such as, for example, 10 kHz, when there is only a single correction, considering the "hunting phenomenon", or the vibrating phenomenon around the designated frequency or tuning point. For this reason, in the described embodiment of the invention, the control voltage generating circuit 60, the characteristic of the variable capacitance diode and the operating condition are determined so that there is a frequency variation of 10 kHz within the period $t2$ to $2t1$, for example, 8 msec. For the convenience of description, the frequency variation range which avoids the "hunting phenomenon" is hereinafter referred to as the minimum setting frequency spacing.

The frequency indicator 83 shows whether or not the outputs of the counters 32, 34 and 35 coincide with the setting value. Digital display tubes of known type may be used as the frequency indicator 83. j When the receiver is an FM receiver, since the frequency is high, in addition to the frequency division of 1/10 by the shaping and dividing circuit 25, it is necessarry that the frequency shift circuit which shifts the local oscillating frequency as much as the IF signal be modified so that when it comes to the lower level of the receiving frequency an intermediate frequency of the FM signal of 10.7 MHz is covered. Therefore, a shift circuit having a complementary operation is used. Furthermore, the frequency discriminator 71 becomes unnecessary and the frequency discriminator 17 directly detects any variation of the intermediate frequency. Frequency setting by 3 digit indication and automatic tuning, as for an AM receiver, are therefore possible. The insertion position of the shift circuit in FIG. 1 naturally differs, in this case, since the IF signal is 10.7 MHz.

In the foregoing description, the control voltage for the variable capacitance diode is applied by means of the voltage memory circuit 81. However, the invention is not restricted to this, and, for example, it is also possible to use a potentiometer.

Each of the components of the tuning control system of FIG. 1 may comprise any suitable known circuit arrangement for providing the function ascribed to it.

The foregoing description is for a basic embodiment of a tuning control system which selects the desired station with digital operation. When automatic tuning is on the basis of the minimum setting frequency spacing, however, there is a disadvantage. In particular, when the difference between the counting value and setting value is comparatively large, for example, when a frequency variation occurs from the receiving condition of 1620 kHz to the setting frequency of 560 kHz in AM broadcasting, considerably frequency sweep time, of approximately 1 sec, is required. For this reason, in operation of the receiver, such frequency sweep is not satisfactory. The tuning control system of the invention overcomes this disadvantage by changing the local oscillating frequency more considerably than the minimum setting frequency spacing in the digital comparator until the counting value of the second uppermost digit coincides with the setting value to be compared. When these values coincide, the local oscillating frequency is changed within the minimum setting frequency spacing, thus shortening the frequency sweep time. This embodiment of the tuning control system of the invention is shown in FIG. 4.

Figure 4:
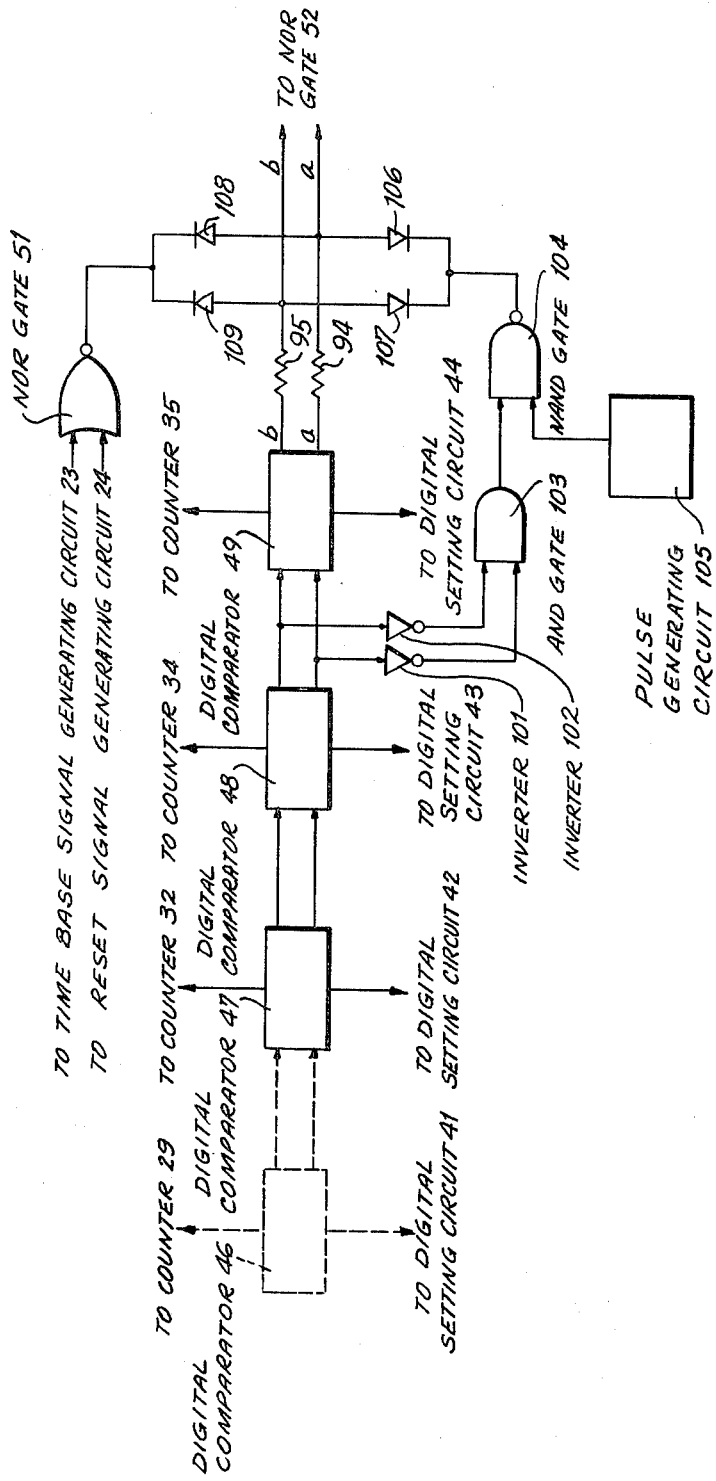
FIG. 4 is a block diagram of part of another embodiment of the radio receiver tuning control system of the invention.

In FIG. 4, the outputs a1 and b1 of the digital comparator 48 are connected to corresponding inputs of the digital comparator 49. The outputs $a$ and $b$ of the digital comparator 49 are connected to the inputs of the NOR gate 52 via resistors 94 and 95, respectively. The output a1 of the digital comparator 48 is coupled to an input of an AND gate 103 via an inverter 101. The output b1 of the digital comparator 48 is coupled to the other input of the AND gate 103 via an inverter 102. The output of the AND gate 103 is connected to an input of a NAND gate 104. The output of a pulse generating circuit 105 is connected to the other input of the NAND gate 104.

The output of the NAND gate 104 is connected in common to the cathodes of a pair of diodes 106 and 107. The output of the NOR gate 51 is connected in common to the cathodes of another pair of diodes 108 and 109. The anodes of the diodes 106 and 108 are connected to each other and to the output $a$ of the digital comparator 49. The anodes of the diodes 107 and 109 are connected to each other and to the output $b$ of the digital comparator 49.

In FIG. 4, the value of the second uppermost digit is branched at the outputs a1 and b1 of the digital comparator 48 for comparison, and the branched outputs are respectively supplied to the inverters 101 and 102. The outputs of the inverters 101 and 102 are connected to the AND gate 103, which provides an output "1" when both inputs are "1". In other words, the AND gate 103 provides an output "1" when the comparison results of the digital comparator 48 coincide. The output "1" is supplied to an input terminal of the NAND gate 104.

The NAND gate 104 receives a pulse train from the pulse generating circuit 105 at its other input terminal. Thus, when the output of the AND gate 103 is "1", the NAND gate 104 provides an intermittent output corresponding to the pulse signal waveform from the pulse generating circuit 105. FIG. 2c shows the waveform of the pulse train from the pulse generating circuit 105. Since the minimum setting frequency spacing is determined by the duty ratio of the pulse from the circuit 105, duty ratio must be selected strictly in accordance with the performance of the control voltage generating circuit 60.

In the embodiment of FIG. 4, a frequency range of 20 kHz may be changed within the period $t2$ to $2t1$, or 8 msec. in addition, each of the control voltage generating circuit 60 and the pulse generating circuit 105 has a duty ratio of ½.

The cathodes of the diodes 106 and 107 are connected in parallel at the cathode and the anodes of said diodes are respectively connected to the outputs $a$ and $b$ of the digital comparator 49. The diodes 106 and 107 become conductive when the NAND gate 104 provides an output "0", bypassing the output of the comparator 49 to said gate. The resistors 94 and 95 are bias resistors of the diodes 106 and 107. Therefore, when the second highest digit coincides as a result of comparison, the output signal waveform of the digital comparator 49 becomes the same as the waveform of pulse train. As a result, the control voltage generating circuit 60 of FIG. 1 is controlled intermittently.

On the other hand, the diodes 108 and 109 permit the digital compartor 49 to provide an output only within the period $t2$ to $2t1$, after the counting result of the counter is determined. When the reset pulse and gate pulse are supplied as inputs to the NOR gate 51, the diodes 108 and 109 become conductive, bypassing the output of the digital comparator 49 to said NOR gate.

The aforedescribed embodiment may operate as an AM receiver. In FIG. 4, the receiving signal is assumed to be 1620 kHz, with the counting value of the counters 29, 32, 34, 35 being 1620. The designated frequency is 560 kHz, so that the setting value is 560. The digital comparator 49 provides output signals of $a = 1$ and $b = 0$, respectively, since the comparison result of said comparator is A > B.

The output signals of the digital comparator 49, provided in its outputs $a$ and $b$, are shown in FIGS. 2d and 2e. These output signals are shaped by the resistors 94 and 95, the diodes 108 and 109 and the NOR gate 51, and are supplied to the control voltage generating circuit 60. As a result, as hereinbefore mentioned, a negative DC control voltage is provided as output from the voltage generating circuit 60. The output voltage level of the voltage memory circuit 81 is thus lowered. The local oscillating frequency may be lowered or decreased by lowering or decreasing the control voltage of the variable capacitance diode. However, in this case, the frequency variation range is 20 kHz, as hereinbefore mentioned, and since the setting is such that it is larger than the minimum setting frequency spacing of 10 kHz, the frequency sweep is made rapidly.

As a result of the rapid frequency sweep, the counting value becomes 1500, and when the second highest digit value "5" coincides, the output of the digital comparator 48 becomes "0", since $a1 = 0$, $b1 = 0$. These output signals are inverted to "1" by the inverters 101 and 102 and supplied to the AND gate 103. The AND gate 103 thereby provides an output "1", and said output signal is then supplied to the NAND gate 104 for logical operation with the pulse signal of the pulse generating circuit 105. As a result, the NAND gate 104 provides an intermittent signal, causing the diodes 106 and 107 to switch to their conductive and non-conductive condition. Thus, the output signal of the digital comparator 49 is partly bypassed.

As hereinbefore described, the output of the digital comparator 49 becomes an intermittent pulse, as shown in FIG. 2f and this signal may serve to lower or decrease the local oscillating frequency. This control is slower in execution than the rapid sweep, since it is the sweep at the minimum setting frequency spacing. The sweep speed becomes approximately ½ the rapid sweep speed.

If a difference occurs again in the comparison for the second digit by the slow frequency sweep, a rapid frequency sweep is started again. As a result, when the counting value reaches 590, the slow frequency sweep is again executed, based on aforementioned operation. Thus, tuning to 560 kHz may be attained without causing the "hunting phenomenon".

Furthermore, when the comparison is completed at the second digit from the upper digit, as in the case of a setting value of 800 or 1400, the comparison is executed as hereinafter described, and no disadvantage arises. In other words, when the setting value is assumed to be 800 and the counting value is assumed to be 720, the second highest digit does not coincide. The outputs of the digital comparator 48 are $a1 = 0$, $b1 = 1$ at A < B, and a rapid frequency sweep is executed for increasing the local oscillating frequency.

Over-correction of the frequency is thus provided, permitting the counting value to reach in the order of 800 such as, for example, 830. At such time, the second highest digit coincides, and a comparison result of A > B, where the digital comparator 48 outputs are $a1 = 1$, $b1 = 0$, may be obtained. A slow frequency sweep is thus executed for lowering the local oscillating frequency, and the receiver may be tuned to 800 kHz. As hereinbefore described, in the embodiment of FIG. 4, the frequency sweep time may be shortened without causing the "hunting phenomenon".

Figure 5:
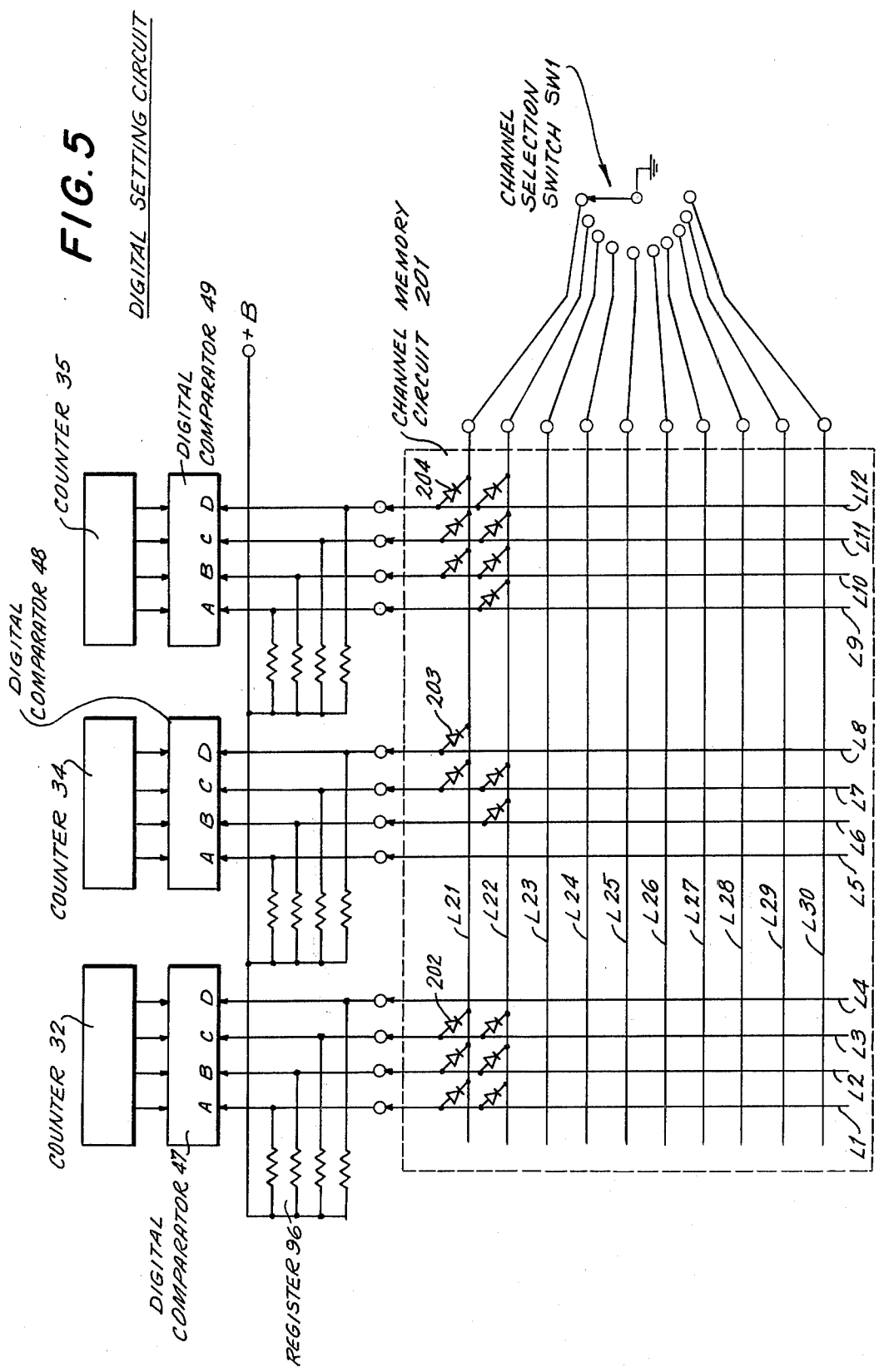
FIG. 5 is a circuit diagram of an embodiment of the digital setting circuit of the tuning control system of the invention.
Figure 6:
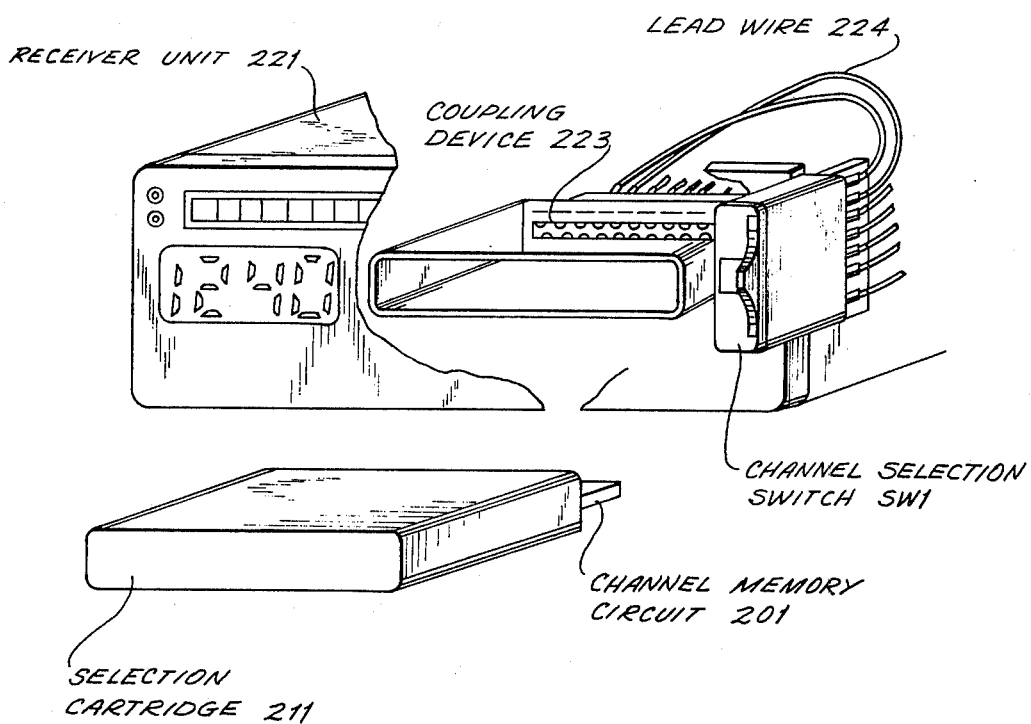
FIG. 6 is a perspective cutaway view of an embodiment of a frequency selection cartridge and the main unit of a receiver in which the digital setting circuit of the invention is utilized.
Figure 7:
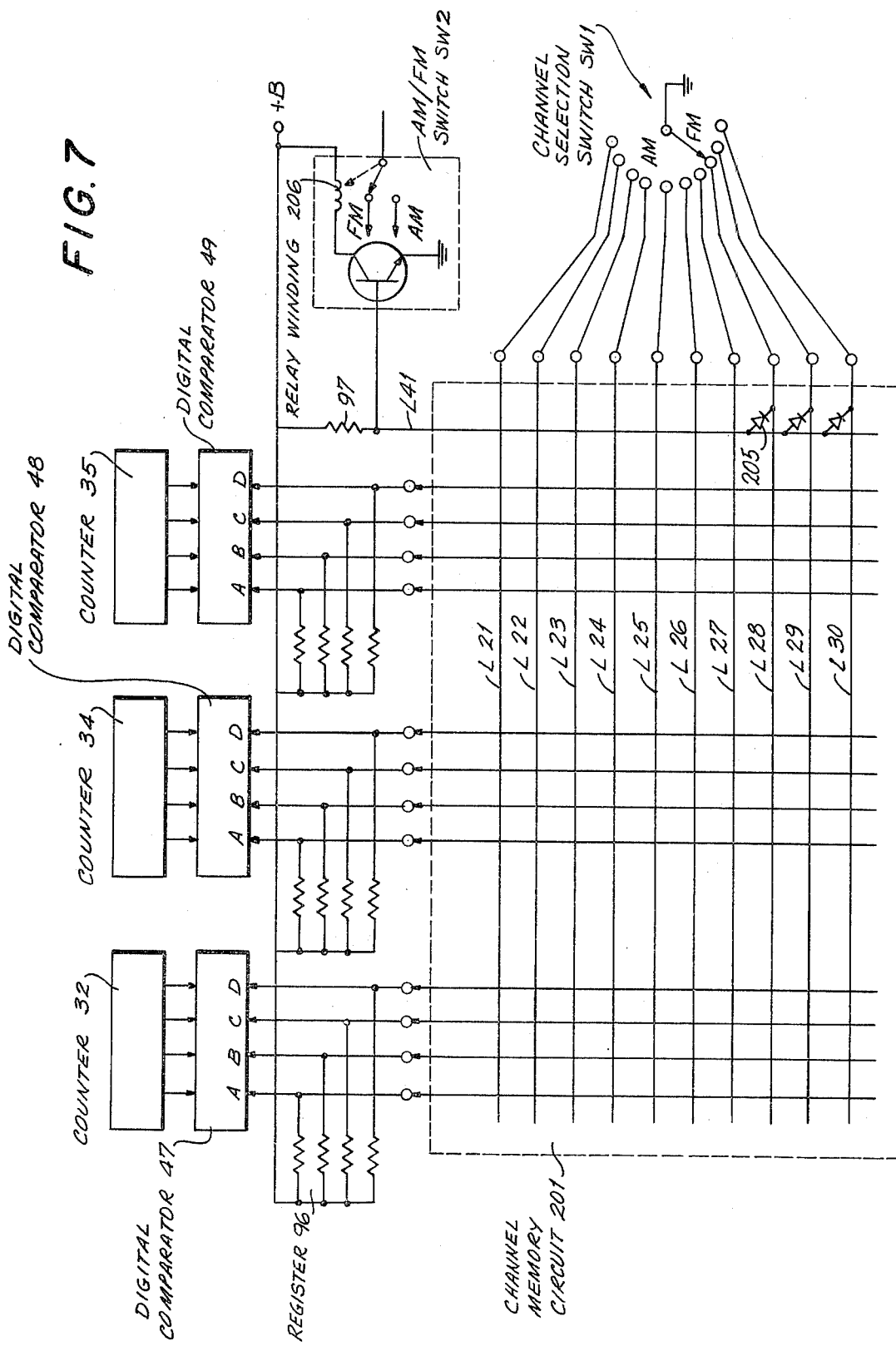
FIG. 7 is a circuit diagram of a modification of the embodiment of the digital setting circuit of FIG. 5.

FIGS. 5 to 7 show an embodiment of an improved digital setting circuit for facilitating the selecting of a desired station. The digital setting circuit utilizes a selection cartridge wherein a channel memory device storing a plurality of designated signals in a diode matrix circuit for selectively providing them as an output is housed in a box type case. A channel selection switch is provided for selectivey extracting the desired designated signal only. The cartridge is removably mounted in the receiver unit.

In the following description of the embodiments of FIGS. 5 and 7, comparison of the digit corresponding to the unit of kHz is omitted, since in the frequency allocation of AM broadcasting, the digit of the kHz unit is almost zero, and the resultant corresponding setting value is always zero.

In FIG. 5, each of the digital comparators 47, 48 and 49 has 4, or a total of 8 binary coded, decimal or BCD code lines, connected to the counters 32, 34, 35, respectively, and to the digital setting circuit. The BCD code lines are all connected, at their digital setting circuit ends, to a register 96. The register 96 is placed in a high "H" level, or "1" signal condition by connecting both ends to a +B power supply. The digital setting for the comparator is accomplished by changing the BCD code lines in the "1" condition to a low "L" level, or "0" signal, according to a desired specified value.

A channel memory circuit 201, which is connected to the register 96, may change the BCD code lines to a "0" signal condition. The memory circuit 201 has a plurality of vertical lines or conductors L1 to L12 formed on a printed circuit board and connected to the BCD code lines and a plurality of lateral lines or conductors L21 to L30 selectively connected to a channel selection switch SW1. These vertical and lateral lines are connected via a plurality of diodes 202, 203, 204, and so on, at specified positions, thus forming the matrix circuit. The signal condition of the BCD code lines is changed from "1" to "0" via the loop, a vertical line, a diode, a lateral line, the channel selection switch and ground.

The lateral lines L21 to L30 correspond to each channel of a plurality of stations. When it is required to specify a frequency of 1380 kHz to the lateral line L21, corresponding to the first channel, the values "1", "3", "8" are sequentially specified to each of the digital comparators 49, 48, 47 via the BCD code lines. It is therefore sufficient for the code lines ABCD to supply the signal "1" = 1000 to the input terminal of the digital comparator 49. The signal "3" = 1100 is similarly supplied to the input terminal of the digital comparator 48. The signal "8" = 0001 is similarly supplied to the input terminal of the digital comparator 47.

Since in the initial stage, all "1" signals are supplied to the digital comparators, these are changed to "0" signals as follows. The signal to the digital comparator 49 becomes BCD, the signal to the digital comparator 48 becomes CD, and the signal to the digital comparator 47 becomes ABC, respectively. Thus, the connection of the diodes 202, 203, 204, and so on, between the lateral line L21 and the vertical lines L1 to L12 to be connected to the BCD code lines to be changed to "0", as shown in FIG. 5, and the connection of said lateral line to ground via the selection switch SW1, permits the values "1", "3", "8" to be provided at the digital comparators 49, 48 and 47, respectively. Since the comparison operation of each digital comparator after such designation is the same as that described, further description is omitted.

The digital setting circuit of the invention permits different frequencies to be set at the lateral lines L2 to L12, corresponding to channel 2 to channel 12. The number of channels is not restricted to channels 1 to 12, only.

The channel memory circuit 201 is housed in a box type case, functioning as a selection cartridge 211. A receiver unit 221 has a cartridge container 222 at its front which permits free removal and insertion or mounting of the selection cartridge 211 and the channel selection switch SW1. a coupling device 223 is provided inside the cartridge container 222 and permits electrical and mechanical coupling of the output terminals, of the vertical lines, of the selection cartridge 211 to the input terminals of the digital comparator and of the input terminals of said selection cartridge to each terminal of the channel selection switch SW1.

As shown in FIGS. 5 and 7, the channel selection switch SW1 is of rotary and sliding type and preferably has a channel indicator. The channel selection switch SW1 may be provided on the receiver unit 221, however, and it is possible to provide the channel indicator at the selection cartridge. The receiver unit 221 includes a lead wire 224.

FIG. 7 shows another embodiment of the digital setting circuit, which is capable of selecting both AM and FM broadcasting frequencies with a single selection cartridge. In other words, the lateral lines L21 to L27 corresponding to channel 1 to channel 7, are provided for AM broadcasting, and the lateral lines L28 to L30, corresponding to channel 8 to channel 10, are provided for FM broadcasting.

A vertical line or conductor L41 is provided for the switching of AM and FM. The vertical line L41 is placed in a "1" signal condition by a resistor 97 and the +B power supply. The line L41 is changed to the "0" condition, however, since the diodes 205, and so on, are connected as shown in FIG. 7 when the receiving mode is switched to FM. Switching between AM and FM is accomplished when an AM/FM switch SW2 arm is switched to the FM contact. This results in the AM/FM switch SW2 being connected to the vertical line L41. A relay winding 206 is deenergized or deactivated when the channel selection switch SW1 switches the vertical conductor L41 to the "0" signal condition. The relay widing 206 controls the operation of the movable relay controlled armature switch arm of the AM/FM switch SW2.

As hereinbefore described, the embodiment of FIG. 7 permits the interchangeable removable mounting of the selection cartridge 211 in the receiver unit 221. Designated signals corresponding to a plurality of broadcasting frequencies are stored or recorded in the cartridge 211. The desired frequency is selected from cartridge with great facility. The aforedescribed selection operation is thus possible for the entire receiving range of the receiver. The embodiments of FIGS. 5, 6 and 7 are thus especially suitable for a mobile radio broadcasting receiver.

While the invention has been described by means of specific examples and in specific embodiments, I do not wish to be limited thereto, for obvious modifications will occur to those skilled in the art without departing from the spirit and scope of the invention.

I claim:

1. A tuning control system for a radio receiver having a tuning circuit including a variable reactance element as the turning element and a local oscillator, said tuning control system comprising
    voltage circuit means for controlling the reactance of the variable reactance element of the tuning circuit of a radio receiver, said voltage circuit means having an output coupled to said variable reactance element and an input;
    gate circuit means connected to the local oscillator of the tuning circuit of the radio receiver for deriving a frequency signal from said local oscillator during a specified period of time and providing said frequency signal;
    counting circuit means connected to said gate circuit means for counting the frequency signal provided by said gate circuit means, said counting circuit means having output means;
    digital setting circuit means for designating a preset frequency of a desired station, said digital setting circuit means having output means;
    digital comparator means having input means connected to the output means of the counting circuit means and the digital setting circuit means for comparing signals in the output means of said counting circuit means and said digital setting circuit means and providing output signals indicating coincidence and non-coincidence of the signals compared thereby, said digital comparator means having output means; and control voltage generating circuit means having input means connected to the output means of the digital comparator means and an output connected to the input of the voltage circuit means for detecting coincidence and non-coincidence indications in the output signals of said comparator means and for controlling the supply of a sweep signal to said voltage circuit means, whereby said radio receiver is automatically tuned to the desired frequency.

2. A tuning control system as claimed in claim 1, wherein said voltage circuit means comprises a voltage memory circuit having a memory element settable at a desired output voltage level and providing an output voltage in accordance with the polarity of a voltage applied thereto.

3. A tuning control system as claimed in claim 1, wherein said gate circuit means comprises time base signal generating circuit means for providing a continuous gate pulse having a predetermined preiod, said time base signal generatig circuit means having an output, a logical AND gate having an input coupled to the local oscillator and another input connected to the output of the time base signal generating circuit means for providing the frequency signal derived from the local oscillator only when said time base signal generating circuit means supplies a time base signal thereto.

4. A tuning control system as claimed in claim 1, further comprising reset signal generating circuit means connected to said counting circuit means for resetting said counting circuit means prior to each counting by said counting circuit means of the frequency signal provided by the gate circuit means.

5. A tuning control system as claimed in claim 1, wherein said counting circuit means comprises counter circuit means and shift circuit means connecting the gate circuit means to the counter circuit means, said shift circuit means shifting the frequency signal provided by the gate circuit means by a number of pulses corresponding to an IF signal of the radio receiver and providing a shifted frequency signal output, and said counter circuit means counting the shifted frequency signal output of said shift circuit means.

6. A tuning control system as claimed in claim 1, wherein the counting circuit means provides an output count signal at the output means thereof, and further comprising frequency indicating means coupled to the output means of said counting circuit means for indicating the output count signal of said counting circuit means as a frequency.

7. A tuning control system as claimed in claim 1, wherein the radio receiver includes a frequency discriminator and further comprising automatic frequency control circuit means having input means connected to the frequency discriminator of the radio receiver and output means connected to the control voltage generating circuit means for detecting a DC voltage in accordance with the shift of the tuning frequency supplied by the frequency discriminator of the receiver and controlling the supply of the sweep signal to said voltage circuit means.

8. A tuning control system as claimed in claim 1, wherein said digital setting circuit means comprises a diode matrix circuit for storing a plurality of designation signals and selection switch means connected to the matrix circuit for selecting a desired designation signal, said diode matrix circuit having outputs.

9. A tuning control system as claimed in claim 8, further comprising a selection cartridge consisting of a box type case and accommodating said diode matrix circuit therein, a receiver housing unit having a cartridge container provided therein for removably accommodating the selection cartridge, and coupling means in the housing unit at the cartridge container for connecting the outputs of the diode matrix circuit to the input means of the digital comparator means when said selection cartridge is mounted in said cartridge container.

10. A tuning control system for a radio receiver having a tuning circuit including a variable reactance element as the tuning element and a local oscillator, said tuning control system comprising voltage circuit means for controlling the reactance of the variable reactance element of the tuning circuit of a radio receiver, said voltage circuit means having an output coupled to the variable reactance element and an input;

gate circuit meansconnected to the local oscillator of the tuning circuit of the radio receiver for deriving a frequency signal from said local oscillator during a specified period of time and providing said frequency signal;

counting circuit means for a plurality of digits connected to said gate circuit means for counting the frequency signal provided by said gate circuit means, said counting circuit means having output means;

digital setting circuit means having a plurality of digits for designating a frequency of a desired station, said digital setting circuit means having output means providing disignated frequency output signals;

digital comparator means having input means connected to the output means of the counting circuit means and the digital setting circuit means for comparing signals in the output means of said counting circuit means and said digital setting circuit means and providing output signals indicating coincidence and non-coincidence of the signals compared thereby, said digital comparator means having output means, said digital comparator means comprising a plurality of digital comparators connected in tandem each comparing the output signals of said counting circuit means and the designated frequency output signals of said digital setting circuit means for each digit, said digital comparators including an ultimate digital comparator comparing the highest digit of said output signals and a penultimate digital comparator comparing the second highest digit of said output signals;

control voltage generating circuit means having input means connected to the output means of the digital comparator means and an output connected to the input of the voltage circuit means for detecting coincidence and non-coincidence indications in the output signals of said comparator means and for controlling the commencement and termination of supply of a sweep signal to said voltage circuit means; and sweep control circuit means connected between the penultimate and ultimate digital comparators of the digital comparator means and the input means of said control voltage generating circuit means for detecting coincidence indications in the output signals of the penultimate one of the digital comparators and intermittently enabling the supply of the sweep signal from said control voltage generating circuit means, whereby said radio receiver is automatically tuned to the desired broadcasting frequency.

11. A tuning control system as claimed in claim 10, wherein said digital setting circuit means comprises a plurality of digital setting circuits each connected to a corresponding one of the digital compartors and each representing a digit of the designated frequency.

12. A tuning control system as claimed in claim 10, wherein said sweep control circuit means comprises a NAND gate having a first input, a second input and an output, a detector circuit for detecting coincidence and non-coincidence of the second highest digit in the output signals of the penultimate digital comparator, said detector circuit having an output connected to the first input of the NAND gate, pulse signal generting means having an output connected to the second input of the NAND gate and clamp means connected to the output of the NAND gate and to the output means of the digital comparator means for clamping part of the output signal of the ultimate digital comparator to a point at ground potential when the output signals of said ultimate digital comparator indicate coincidence in correspondence with an intermittent output signal from said NAND gate.

* * * * *